United States Patent [19]
Kepros

[11] Patent Number: 5,404,364
[45] Date of Patent: Apr. 4, 1995

[54] OPTICALLY PUMPED X-RAY LASER AND APPLICATIONS THEREOF

[76] Inventor: John G. Kepros, 860 S. 600 East, Salt Lake City, Utah 84102

[21] Appl. No.: 175,102

[22] Filed: Dec. 29, 1993

[51] Int. Cl.$^6$ .............................................. H01S 3/30
[52] U.S. Cl. ........................................ 372/5; 372/69; 372/39
[58] Field of Search ....................... 372/39, 76, 5, 69

[56] References Cited

U.S. PATENT DOCUMENTS

| | | | |
|---|---|---|---|
| 4,159,453 | 6/1979 | Brandt et al. | 372/5 |
| 4,229,708 | 10/1980 | Mani et al. | 372/5 |
| 4,592,064 | 5/1986 | Silfvast | 372/5 |
| 4,660,203 | 4/1987 | Hagelstein | 372/5 |

Primary Examiner—Léon Scott, Jr.
Attorney, Agent, or Firm—Trask, Britt & Rossa

[57] ABSTRACT

A method of producing collimated x-radiation by suitably subjecting metallic ions in the presence of lower Z ions to a pulse of laser energy from a conventional laser. An improvement on said conventional laser in order to increase the reliability of production of said collimated x-radiation. An alternative improvement on said conventional laser for similar improvement of said collimated x-radiation. An example of the application of the use of said collimated x-radiation to the art of producing micro-circuitry.

19 Claims, 2 Drawing Sheets

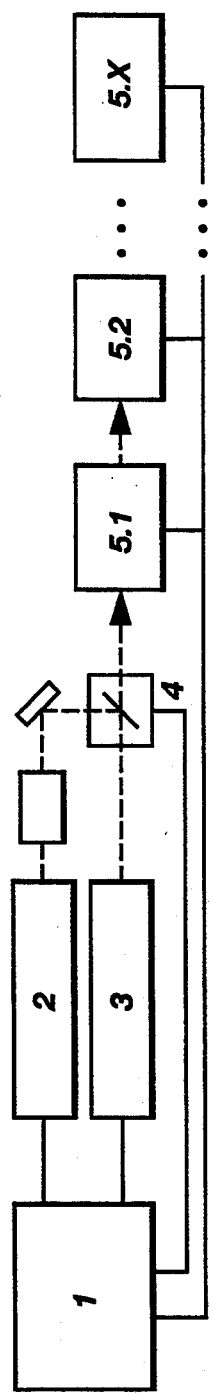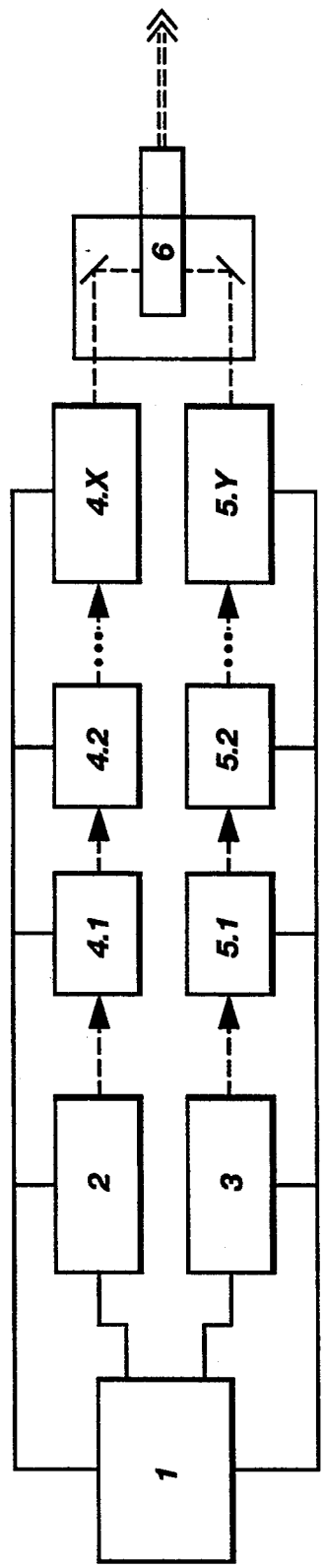
Fig. 2
Fig. 3

OPTICALLY PUMPED X-RAY LASER AND APPLICATIONS THEREOF

BACKGROUND OF THE INVENTION

1. Field of the Invention

This invention relates to laser-producing collimated x-radiation via impingement of optically-peaked laser radiation onto a metallic ion target.

2. State of the Art

Since the first reported Light Amplification of Stimulated Emission of Radiation (laser action in the visible spectrum) in approximately 1960, continuous progress has been made by various researchers in obtaining laser action at shorter and shorter wavelengths. It has long been felt that an x-ray laser could be developed that would radiate at x-ray wavelengths of less than 5 Angstrom units. X-radiation at these wavelengths is often referred to as a "warm" x-ray and, as such, would travel significant distances through the air.

The potential uses for such "warm" x-radiation having the laser characteristic of being collimated are significant. For example, it may be possible for a physician to foresee the use of a highly collimated x-ray beam as a selective scalpel for use in various types of surgery. Both the chemist and biologist could possibly use x-ray holography as a means for following time dependent three dimensional phenomena at a submicroscopic level. Similarly, the genetic researcher could potentially modify a part of a gene and immediately review said gene to determine if that part had truly been modified. The designer of microcircuitry who presently uses a visible laser to produce a 1.0 centimeter square integrated circuit could theoretically use an x-ray laser to put the sane circuit on a 10.0 micrometer-sized device. Additionally, the interaction of intense coherent x-ray pulses with nuclei could provide valuable new information of interest to physicists.

Potentially, with the use of such "warm" coherent x-radiation, one skilled in the arts of these disciplines could perform such tasks without having to resort to elaborate vacuum systems and thus could operate in ambient air, when appropriate.

One system previously explored for the general purposes of the invention is set forth in U.S. Pat. No. 3,882,312 of Kepros et al. This system, however, achieved only low power sustainable laser beams as only transmitting high peaks of energy under generally unpredictable and uncontrolled conditions.

SUMMARY

In the present invention (as in its progenitor, on which this improvement is based) the feasibility of producing coherent radiation within the x-ray wavelength region has been demonstrated. Further refinements of this basic development will, of course, be forthcoming once the initial concept as taught herein is fully disclosed to those skilled in the art.

It is therefore an object of this invention to provide improvements in lasers capable of producing collimated radiation of the x-ray wavelength.

It is another object of this invention to provide collimated x-radiation having a wavelength of less than 5 Angstrom units.

It is another object of this invention to provide a method for producing collimated x-radiation from metallic ions in the presence of lower Z (lower atomic number) ions by subjecting said metallic ions and lower Z ions to laser radiation of the near infrared spectrum.

It is another object of this invention to provide a method for producing collimated x-radiation from metallic ions in the presence of lower Z ions after subjection to laser radiation of the near infrared spectrum and the essentially complete ionization of both the metallic ions and the nearby lower Z ions with the stripped electrons forming a background cloud. Such a collection of highly ionized multiple species ions with the background electron cloud is commonly called a complex plasma.

It is another object of this invention to provide a method for producing collimated x-radiation from metallic ions in the presence of lower Z ions after the creation of said complex plasma by the formation of quasi-stable molecules consisting of highly-ionized metallic ions and nearby lower Z ions, whereby one or more of the nearby lower Z ions has recombined with an electron changing the nature of the lower Z ion into a lower Z dipole, the result of said recombination is an electrostatic attraction between each highly-ionized metallic ion and a lower Z dipole. (In the specific case where $Z=1$ (hydrogen), said electrostatic interaction is exceptionally strong.)

It is another object of this invention to provide a method for producing collimated x-radiation after creation of said quasi-stable molecules in this complex plasma by the dipole-allowed transition of an electron from the lower Z component of these molecules to the highly-ionized component of these same molecules.

It is another object of this invention to provide a method for producing collimated x-radiation after the electronic transition in these quasi-stable molecules by the stimulated emission of x-radiation from nearby quasi-stable molecules which have not yet undergone dipole-allowed transition. Said stimulated emission is commonly referred to as lasing.

It is another object of this invention to provide a method of producing pumping laser radiation which simulates so-called "gain-pulse spikes," the purpose of said simulation being to create controllable conditions conducive to said production of x-ray lasing. The method of producing said pumping laser radiation requires the simultaneous use of two laser oscillators, one mode-locked and the other Q-switched, with the appropriate "laser injection" of a pulse (or train of pulses) from the former into the oscillator stage of the latter preparatory to subsequent amplification and final use as a pumping source for said x-ray laser-producing plasma.

It is another object of this invention to provide an alternate method of producing pumping laser radiation which simulates so-called "gain-pulse spikes." The purpose of said simulation is identical to that expressed above. The alternate method of producing said pumping laser radiation also requires the simultaneous use of two laser oscillators, one mode-locked and the other Q-Switched, but with separate amplification of output and final optical merging for simultaneous use as a pumping source for said x-ray laser producing plasma.

It is another object of this invention to provide a method of application of said x-ray laser light in the process of "reading" a hologram produced by a longer wavelength laser. Such "reading" produces an holographic image reduced in dimension by the ratio of said respective wavelengths. The holographic reduction also maintains the topographic characteristics of the original object. These and other objects of this invention will become more fully apparent by reference to the drawing no. 1 (identical to the drawing of the progenitor patent), drawings 2, and 3 with and accompanying descriptions and the claims relating thereto.

BRIEF DESCRIPTION OF THE DRAWINGS

FIG. 2 is a schematic of a dual-oscillating injection laser system for creating an x-ray lasing plasma.

FIG. 3 is a schematic of a dual oscillator/amplification system for an optical laser system.

DETAILED DESCRIPTION OF INVENTION

Figure 1:
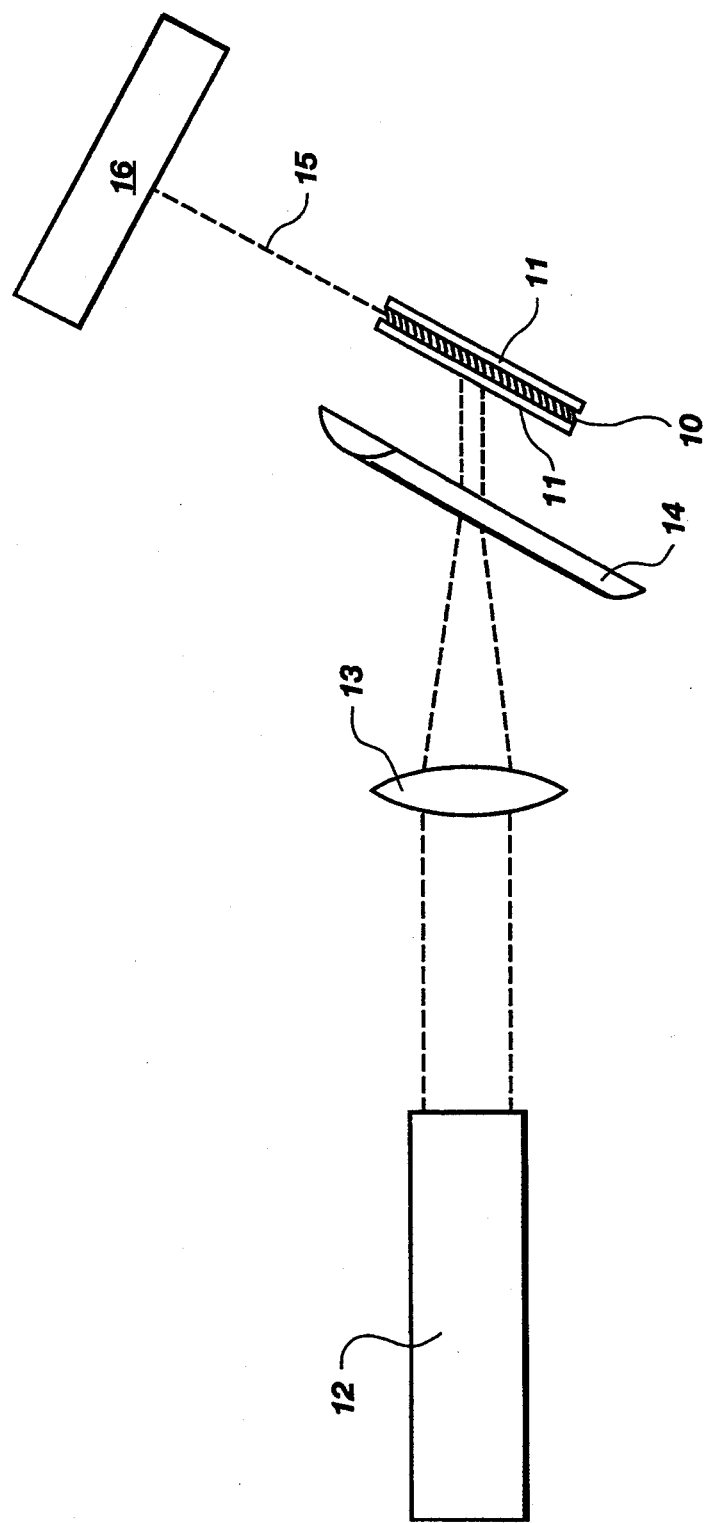
FIG. 1 is a schematic view of an x-ray-producing laser system.

FIG. 1 is a schematic of the x-ray laser system and is more fully described hereinafter.

Referring to the drawing, a layer of metallic ions with accompanying lower Z ions is shown generally at 10 and is supported as a thin layer, in this embodiment, by conventional microscope cover glass slips 11 to form thereby a "sandwich". A laser of the near infrared spectrum is shown at 12. Radiation of the near infrared wavelength is shown in outline form by dashed lines emanating from laser 12. A conventional focusing system is shown generally at 13. A cylindrical focusing lens 14 focuses the radiation pulse from laser 12 into a near vertically i.e. at a right angle or acute angle from the vertical and, preferably, at an angle which is normal to said layer of metallic ions and lower Z ions or at an angle 0° to 25° from a direction normal to said layer, linear pulse on the metallic ions and lower Z ions 10. The x-ray laser emission produced from the quasi-molecules is illustrated by dashed lines 15. A detection device for detecting the x-radiation 15 is shown generally at 16.

The quasi-stable molecules capable of producing x-radiation when subjected to laser energy of the near infrared wavelength are molecules containing neutral hydrogen atoms combined with ions of copper, iron or zinc. Compounds of these metals having high solubility in water (the source of hydrogen) were considered in these experiments. In this case, these compounds are copper sulfate, zinc sulfate, and ferrous sulfate. For purposes of simplicity and to assist in the understanding of this invention, the description of the x-ray laser will center around the use of the copper ions as the metallic ions.

In the progenitor patent, a gel was used for ease of handling. In subsequent work, it was found that the gel was irrelevant to the effect. The critical component was the aqueous complexed-solution of $CuSO_4$. In a commonly-used solution (one of several successful concentrations of ions) such as 10E−3M, the relative populations are: Cu, 1; S, 1; O, 5.55×10E+4; and H, 1.11×10E+5. In such a solution, the copper ion is initially complexed to six hydroxyl radicals. If this general structure were to somehow survive into the plasma state, an allowed Molecular Orbital: Linear Combination of Atomic Orbitals (MO:LCAO) dipole transition is possible. One such transition is:

$$\hat{r}_{ij} = (1S_H 1\hat{r} 12P_{Cu+27})$$

The wavelength associated with this transition is 4.75 Angstroms. The unbroadened minimum spontaneous lifetime is estimated as 6.0×10E−11 s. The above transition can be associated with a quasi-stable molecule essentially consisting of a neutral hydrogen atom in the presence of a highly-stripped Cu ion (Cu+27). The hydrogen atom, unlike the hydrogen ion, is strongly attracted to the highly charged copper ion while said hydrogen ion is very strongly repulsed. Also, in the progenitor patent and in fact, in all other patents dealing with x-ray laser action, there is no mention of a molecular transition. There is only a description of atomic action with occasional description of transfer of energy between different components by collisional means. Although said MO:LCAO techniques are known to those skilled in the arts of visible wavelength laser design such as the dye laser, the application of said technology to design of lasers in the x-ray part of the spectrum is heretofore unprecedented.

Several features of the experiments used well-known techniques associated with the arts of laser plasma formation to enhance the efficiency of the experiments. First was the use of microscope cover slips to couple the laser energy into the plasma. Researchers skilled in the related arts associated with Laser-Initiated Fusion have long maintained that the glass microballoon was a key element in said energy transfer. Second, as the plasma was formed in air, the plasma was not freely expanding as it is in a vacuum. This containment gives rise to higher initial plasma temperatures and, potentially, could give rise to higher temperatures throughout the lifetime of the plasma. As the temperature of the plasma is a measure of the kinetic energy stored in the plasma, those skilled in the related art of vacuum plasma formation go to great lengths for even modest magnetic containment of the plasma. Finally, after review of the arts associated with pumping laser operation, the existence of gain-pulse spikes was recognized (and found to exist in the pumping laser). Said gain-pulse spikes are minimized by first "warming up the laser" by blocking lasing in the oscillator stage by physically inserting an opaque object in the cavity for a few initial cycles. After doing so, a so-called nominal pulse is obtained. The nominal pulse is relatively free of intense spikes. On the other hand, if the system is allowed to rest, especially for several weeks, and then operated WITHOUT said "warming up of the laser", the initial pulse has potentially rod-damaging gain-pulse spikes which are subsequently amplified in the amplifier train of the laser. Those skilled in the art of Nd:glass laser operation estimate the intensity of the spikes might be amplified to an intensity two- to three-orders of magnitude above nominal. In such a situation, a 10 GW laser (nominal pulse power) might perform more like a 10 TW laser for its initial pulse. The combined and patient use of said special techniques, in the short term, provide a means for those skilled in the art of x-ray laser development to maximize the efficacy of their laboratory equipment.

In a preferred embodiment, the pumping laser of the instant invention has two coupled oscillator cavities, shown in FIG. 2. The first has a Q-switched Nd:glass system producing a nominal 20-nanosecond pulse at 1.06 micrometers. The second has a mode-locked Nd:YAG oscillator, operating simultaneously at 1.064 micrometers, producing a 30–60 picosecond pulse. This shorter pulse would be injected directly into the Nd:glass oscillator, forming a so-called injection laser oscillator, the output of which would be amplified by means of suitable amplification stages with rods or slabs of Nd:glass or Nd:YLF. Alternatively, said mode-locked pulse could be separately amplified and then combined for final amplification, shown in FIG. 3. In either case, such an inventive pumping system simulates the condition obtained by operating a ND:glass laser system with gain-pulse spikes present and available to interact with the x-ray source.

As an intense pulse of laser radiation from cylindrical focusing lens 14 (which lens causes the pulse to be essentially focused to a line when viewed in cross section) strikes the aqueous copper sulfate solution 10, especially in the slightly canted configuration, the leading edge of said pulse of radiation causes excitation of the copper ions in said solution system. As the travelling wave front continues to travel along the canted aqueous system (even if only infinitesimally canted) each succeeding part of the pulse front amplifies the previous x-radiation produced from the MO:LCAO molecules in the aqueous system to produce x-radiation travelling along a line defined by the linear pulse front and collinear with the irradiated portion of the aqueous copper surfate solution system. An angular orientation of the copper sulfate solution system to the axis of the incoming radiation pulse for the presently preferred embodiment has been found to be between nearly zero degrees and approximately 25 degrees.

In the presently preferred embodiment, the pumping source, or laser of the near infrared spectrum which is shown generally at 12, is a Q-switched, vertically polarized, Nd:glass oscillator-amplifier of four stages, at onetime commercially available through the now defunct Apollo Lasers, Inc. This laser operates at a wave length in the near infrared spectrum of 1.06 micrometers and is controlled to produce nominal pulses of duration 20-nanosecond with total energy of up to 200 joules. This translates into an average power of up to 10 Giga-watts. The instantaneous power, in the situation arising in the case of gain-pulse-spikes may be regarded to be as great as 10 Tera-watts. Operation of the system without warns-up produces such power. Alternatively, operation with dual oscillators, as described hereinafter, produces such power.

The x-my source or metallic ion molecule solution sheet was prepared by dilution of a 0.1M aqueous solution of reagent grade, anhydrous copper sulfate ($CuSO_4$) to 10 or 1 millimolar. A sandwich of the solution was then prepared by placing a film of the solution between two microscope cover glasses, sometimes known as cover "slips" (number 1 cover glass, 0.013 cm thick). The thickness of the film was controlled, largely, by the surface tension of the copper sulfate solution. The position of the copper sulfate solution sandwich was arranged to be adjustable within the range of the focal length of the cylindrical lens 14.

Procedures used to detect the x-radiation produced from the metallic ion molecules comprised standard, photographic methods for detecting x-radiation. In one such detector system, double-emulsion, medical x-ray film was used. In this particular system, commercially available film sold under the trade name Kodak NS-392T was used. The film was protected from light by four layers of black photographic paper which had been sealed with photographic tape. The encased film was then wrapped in from one to four layers of 13 micrometer thick aluminum foil to prevent exposure of the film by soft x-rays and by spurious, reflected infrared laser radiation. As the film was exposed (reacted to the effects of x-radiation) only on the first surface or emulsion nearest the radiation source, such exposure is consistent with and supportive of the wavelength (4.75 Angstroms) predicted by the MO:LCAO theory.

In another detection procedure, the photographic film pack, used at 16, was replaced by a slightly modified Polaroid XR-7 x-ray detection camera. The Polaroid XR-7 Camera system is commercially available from the Polaroid Corporation. It is a system with a black mylar window (opaque to visible, ultraviolet, and infrared light), a thin aluminum plate (located approximately 1 cm from the mylar window) is used to press Polaroid Type 54 film against a ZnS intensifier screen. The system, as with many Polaroid Corp. products is "self developing". One modification consisted of taping a single layer of gold leaf to the inside of the black mylar window. The second modification was in protecting the mylar window from blast debris with a sheet of photographic paper or, sometimes, with a layer of aluminum foil. In the configuration with photographic paper shield and gold leaf scattering medium, the camera works as a so-called "powder diffraction" spectrometer. When the camera system is calibrated using normal-angle of incidence copper k-alpha radiation (with wavelength of approximately 1.5 Angstroms), a series of concentric circles, representing the successive diffraction orders is observed. Also, when the angle of incidence is even a few degrees off-normal, the pattern is slightly elliptic. Thus, the appearance of the plasma x-radiation diffraction pattern, in a slightly elliptic pattern only near the third-order position and with the central or zero-order beam also present is consistent with the wavelength, 4.75 Angstroms, predicted by the MO:LCAO model and with a camera system almost ideally aligned normally to the incident x-radiation beam.

The property of collimation of the x-radiation produced, a prime indicator of lasing, was indicated by changing the distance of the detector 16 from the source of radiation. In each instance them was no significant increase in the size of the exposed portion of the film, thus indicating collimation. Cylindrical lens 14 and the glass, metallic ion solution sandwich comprising 11 and 10, respectively, were placed parallel to one another. In this arrangement, the leading edge of the Nd:glass laser pulse pumps the MO:LCAO lasing medium directly in front of material that has just been pumped. Using this travelling-wave method of pumping, a population inversion is created with the result that emitted x-radiation is amplified as it travels along the copper-solution plasma. It should therefore be obvious that media that require high intensity, fast rise-times, and long pumping regions to produce detectable radiation should be easily pumped by this method. On the other hand, the brute-force frontal assault, using other lens systems, results in a very short pumped region that thus limits the gain.

It has therefore been shown that this invention has produced collimation of a beam of radiation and that said radiation was not completely absorbed by intervening air, layers of aluminum foil, and photographic paper, thus indicating that said collimated radiation was warm x-radiation. Furthermore, the absorption characteristics of the radiation with regard to transmission by said materials and subsequent absorption by silver bromide photographic emulsion and also the interaction of said x-radiation with thin gold leaf in a so-called "powder pattern" is consistent with and supportive of the MO:LCAO model used to predict said x-radiation.

The concept of an injection laser is familiar to those skilled in the art of laser design. A lasing system suitably using an injection system is illustrated in FIG. 2. The injection of one laser beam (usually CW or continuous wave) into the other laser resonant cavity is often used to assure coherence between separate pulses of a pulsed laser. In the present embodiment, the injection aspect is especially useful for producing a nominal laser pulse with intense spikes superposed. This is intended to simulate, in a controlled manner, the conditions associated with transient gain-pulse spikes superposed on a nominal plasma-producing pulse.

The components of such a system have the following functions:

1. The power supply, controls, and timing electronics subsystem energizes the two laser oscillator stages so that they function simultaneously. The power supply charges the capacitor banks which energize both oscillator-stage flash lamps and appropriately energize the flash lamps in the amplifier stages. The system electro-optically controls the output of the mode-locked oscillator so that as few as one pulse is emitted or a train of two or more pulses are produced during the duration of the Q-Switched laser pulse. The subsystem also activates and controls the amplifier isolation devices (used to prevent damage from laser light reflecting from the target or final plasma and returning through the amplifier system).

2. The mode-locked oscillator is used to produce very intense laser pulses of a duration of only a few picoseconds. A common lasing medium for such a device is Nd:YAG. Said mode-locked pulses, operating at 1.064 micrometers wavelength, could be introduced directly into the Q-Switched Nd:Glass oscillator or could be pre-amplified, as required, to obtain the desired system output.

3. The Q-Switched Nd:Glass oscillator, operating at 1.06 micrometers wavelength, blocks all laser function electro-optically until it is ready to fire. At that time, the electro-optic shutter changes its polarization, allowing appropriately polarized light to pass. The combination of the two laser beams is then emitted through the beam splitter to the amplifier-/isolator train.

4. The beamsplitter is a flat partly-transmitting and partly-reflecting passive optical element.

5. The amplifier/isolator train consists of x-number of elements (perhaps up to but not limited to as many as ten, limited by space and cost). The number of amplification stages is dependent on the specific gain characteristics of the amplifying medium, the efficiency of the system design in producing amplification, and the physical limits associated with minimal damage (preferably damage-free) pumping laser operation. The total number of amplification stages is determined by the power-on-target requirements (POTR). In the present embodiment, this is estimated to be approximately 10.0 GW Q-Switched and 1.0 TW mode-locked power.

Commonly, a spatial-filtering, beam-expanding, and return-isolating module is attached to each amplifying stage. Specific designs may not necessarily include complete modules (or even partial modules) with every amplification stage (sometimes considered as an initial cost-savings step). The aforementioned minimum POTR can be achieved by either of the specific designs described herein.

A device, producing pulses similar to the pulses produced by the preceding pumping laser described in FIG. 2, which produces and amplifies the beams in separate channels and finally combines the amplified beams, could also be used to produce intense spikes superposed on a nominal plasma-producing pulse is shown in FIG. 3. This device differs from the previous device by having separate amplifier chains for each wavelength, total simultaneous electronic control of the individual oscillators, and a final stage consisting of a beam-combining optical system.

The components of such a system have the following functions:

1. The power supply, controls, and timing electronics subsystem energizes the two laser oscillator stages so that they operate simultaneously. The power supply charges the capacitor banks which energize both oscillator-stage flash lamps and appropriately energize the flash lamps in the various stages of both amplifier trains. The system electro-optically controls output of the oscillator so that as few as one pulse is emitted or that a train of two or more pulses are produced during the duration of the Q-Switched laser pulse. This system differs from the preceding system by NOT INJECTING the mode-locked pulses into the Q-Switched oscillator laser cavity. The subsystem also activates and controls the amplifier isolation devices (used to prevent damage from laser light reflecting from the target or final plasma and returning through the amplifier system).

2. The mode-locked oscillator is used to produce very intense laser pulses of duration of only a few picoseconds. A common lasing medium for such a device is ND:YAG. Said mode-locked pulses, operating at 1.064 micrometers wavelength could be introduced directly into an appropriate amplifier train to produce a final, short duration pulse (or pulses) with peak power of 1.0 TW delivered from the output element of the beam-combining stage.

3. The Q-Switched Nd:Glass oscillator is used to produce intense laser pulses of duration 20.0–30.0 nanoseconds. Said Q-Switched pulse, operating at 1.06 micrometers wavelength could be introduced into the appropriate amplifier train to produce a final pulse with peak power of 10.0 GW delivered from the output element of the beam-combining stage (POTR).

4. The Mode-lock (M-L) amplifier/isolator train consists of x-number of elements (perhaps up to but not limited to as many as ten, limited by space and cost). The number of amplification stages is dependent on the specific gain characteristics of the amplifying mediums, the efficiency of the system design in producing amplification, and the physical limits associated with minimal damage (preferably damage-free) pumping laser operation. The total number of M-L amplification stages is determined by the POTR. In the present embodiment, for this amplifier train, this is estimated to be approximately 1.0 TW.

Commonly, a spatial-filtering, beam-expanding, and return-isolating module (FEIM) is attached to each amplifying stage. Specific designs may not necessarily include complete modules (or even partial modules) with every amplification stage.

5. The Q-Switched (Q-S) amplifier train consists of y-number of elements (perhaps up to but not limited to as many as ten). The total number of Q-S amplification stages is determined by the POTR. In the present embodiment, for this amplifier train, this is estimated to be approximately 10.0 GW.

As with the M-L amplifier system, an FEIM is usually associated with each amplification stage. Specific designs may vary with the completeness of each FEIM.

6. The beam-combining optical system takes the two amplified laser beams and co-locates them so that they can be directed to the target which subsequently produces coherent x-radiation.

As indicated hereinabove, the unique laser of this invention may have a multiplicity of uses. A particularly novel use is in the field of microcircuitry design and manufacture.

Specifically, in the case of microcircuitry, the procedure (though novel) is straightforward. First, a hologram is made of a macroscopic integrated circuit (IC), using a visible-wavelength laser such as a He Ne laser operating at 6328 angstroms. Said hologram is then illuminated with a coherent x-ray source such as the one described herein operating at a wavelength of approximately 4.75 angstroms. The illumination of the hologram by such a short-wavelength laser, used in conjunction with a photoresist medium would result in an IC with dimensions magnified by the ratio of the wavelengths. In this specific case, the linear magnification would be $7.51 \times 10E-4$ (or $5.63 \times 10E-7$ in area magnification). The resultant micro-mask would be identical in function to the original, but occupy less than a millionth of the area. It should be noted that the procedure of holographic magnification using a larger ratio (greater than 1.0) is well known to those skilled in the arts of holography. However, the use of a shorter second wavelength is novel and the use of a laser operating in the x-ray region of the spectrum to "read" the hologram is heretofore unprecedented.

What is claimed is:

1. A method of producing collimated radiation of x-ray wavelength comprising:
    producing a pulse of laser radiation in a near infrared spectrum;
    focusing said pulse of laser radiation into a linear pumping beam; and
    contacting a mixed layer of metallic ions and hydrogen ions with said linear pumping beam at an angle of about 0° from a direction normal to a plane of said layer of metallic ions and hydrogen ions, said pulse of laser energy exciting said metal ions and said hydrogen ions thereby generating a collimated beam of x-radiation.

2. A method of producing collimated radiation of x-ray wavelength as defined in claim 1, wherein said metallic ions comprise copper ions.

3. A method of producing collimated radiation of x-ray wavelength as defined in claim 2, wherein said copper ions and hydrogen ions are present in copper sulfate dissolved in an aqueous system.

4. A method of producing collimated radiation of x-ray wavelength as defined in claim 1, wherein said metallic ions comprise iron ions.

5. A method of producing collimated radiation of the x-ray wavelength as defined in claim 4, wherein said iron ions and hydrogen ions are present in ferrous sulfate dissolved in an aqueous system.

6. A method of producing collimated radiation of x-ray wavelength as defined in claim 1, wherein said metallic ions comprise zinc ions.

7. A method of producing collimated radiation of x-ray wavelength as defined in claim 6, wherein zinc ions and hydrogen ions are present as zinc sulfate dissolved in an aqueous system.

8. A method of producing collimated radiation of x-ray wavelength as defined in claim 1, wherein a neodymium-doped laser operable to emit laser radiation at a wavelength of about 1.06 micrometers is utilized to produce said pulse of near infrared radiation.

9. A method of producing collimated radiation of x-ray wavelength as defined in claim 8, wherein said pulse of radiation has a pulse front which rises exponentially.

10. A method of producing collimated radiation of x-ray wavelength comprising:
    producing a pulse beam of collimated laser radiation in a near infrared spectrum;
    placing a mixed layer of metallic ions and hydrogen ions in the path of said beam, the plane of said layer forming an acute angle, up to and including a right-angle, with said beam; and
    emitting a collimated beam of x-ray radiation directly from said layer upon striking said layer with said pulse beam.

11. Apparatus for producing a high power x-ray laser beam:
    a laser system producing a pulse of laser radiation in a near infrared spectrum, said laser having two oscillation cavities, one cavity feeding the other;
    a focusing system capable of focusing said pulse of laser radiation into a linear beam;
    a mixed layer of metallic ions and hydrogen ions in the focal range of said focusing system with a plane of said layer being transverse to a plane of said beam; and
    means to pump said laser system to cause a pulse of laser energy in a near infrared spectrum to excite the metal ions and the hydrogen ions to generate a beam of collimated x-radiation.

12. The apparatus of claim 11, wherein said laser system comprises a first laser producing a nominal 20 nanosecond pulse at 1.06 micrometers and a second laser capable of operating simultaneously with said first laser, said second laser producing a nominal 30-60 picosecond pulse (or pulse train) at 1.064 micrometers, said second pulse (or pulse train) injecting directly into the oscillator of said first laser.

13. The apparatus of claim 11, wherein said pulse of said laser system is directed into an amplifier system.

14. The apparatus of claim 13, wherein said amplifier system contains Nd:Glass or Nd:YLF amplification members through which said laser output pulse is passed.

15. Apparatus for producing a high power x-ray laser beam:
    a laser system producing a pulse of laser radiation in near infrared spectrum, said laser having two oscillation cavities operating simultaneously;
    a focusing system capable of focusing said laser radiation into a linear beam;
    a mixed layer of metallic ions and hydrogen ions in the focal range of said focusing system with a plane of said mixed layer being at an acute angle up to a right angle to a plane of said beam; and
    means to pump said laser system to cause a pulse of laser energy in a near infrared spectrum to excite said metal ions and the hydrogen ions to generate a beam of collimated x-ray radiation.

16. The apparatus of claim 15, wherein said laser system comprises a first laser producing a nominal 20.0 nanosecond pulse at 1.06 micrometers and a second laser capable of operating simultaneously with said first laser, said second laser producing a nominal 30.0–60.0 picosecond pulse (or pulse train) at 1.064 micrometers.

17. The apparatus of claim 15, wherein said pulse of said laser system directed into parallel amplifying systems.

18. The apparatus of claim 17 wherein said amplifier system contains Nd:Glass, ND:YLF, or Nd:YAG amplification members through which said laser output pulse is passed.

19. The apparatus of claim 17 wherein the outputs of the two parallel amplification systems are combined into a single pulse by an additional optical system.

* * * * *

UNITED STATES PATENT AND TRADEMARK OFFICE
CERTIFICATE OF CORRECTION

PATENT NO. : 5,404,364
DATED : April 4, 1995
INVENTOR(S) : John G. Kepros

It is certified that error appears in the above-indentified patent and that said Letters Patent is hereby corrected as shown below:

In Column 9, line 66, after "wherein" insert --said--;

In Column 10, line 3, after "doped" insert --glass--;

In Column 10, line 52, after "in" insert --a--; and

In Column 11, line 4, after "system" insert --is--.

Signed and Sealed this

Tenth Day of October, 1995

Attest:

BRUCE LEHMAN

Attesting Officer

Commissioner of Patents and Trademarks